(12) United States Patent
Lin et al.

(10) Patent No.: US 10,446,716 B2
(45) Date of Patent: Oct. 15, 2019

(54) DISPLAY DEVICES

(71) Applicant: InnoLux Corporation, Miao-Li County (TW)

(72) Inventors: Chun-Hsien Lin, Miao-Li County (TW); Jian-Jung Shih, Miao-Li County (TW); Tsau-Hua Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/968,878

(22) Filed: May 2, 2018

(65) Prior Publication Data

US 2018/0323356 A1 Nov. 8, 2018

Related U.S. Application Data

(60) Provisional application No. 62/500,539, filed on May 3, 2017.

(30) Foreign Application Priority Data

Sep. 27, 2017 (CN) .......................... 2017 1 0888168

(51) Int. Cl.
*H01L 33/38* (2010.01)
*H01L 33/62* (2010.01)
*H01L 27/12* (2006.01)
*H01L 25/075* (2006.01)
*H01L 23/498* (2006.01)
*H01L 25/16* (2006.01)
*H01L 33/00* (2010.01)
(Continued)

(52) U.S. Cl.
CPC ........ *H01L 33/38* (2013.01); *H01L 23/49838* (2013.01); *H01L 25/0753* (2013.01); *H01L 25/167* (2013.01); *H01L 27/1244* (2013.01); *H01L 33/62* (2013.01); *H01L 33/0095* (2013.01); *H01L 33/20* (2013.01); *H01L 33/58* (2013.01)

(58) Field of Classification Search
CPC ... H01L 23/49838; H01L 33/38; H01L 33/62; H01L 25/0753; H01L 25/167; H01L 27/1244; H01L 33/0095; H01L 33/20; H01L 33/58
See application file for complete search history.

(56) References Cited

U.S. PATENT DOCUMENTS

2012/0241760 A1* 9/2012 Okabe ................ H01L 33/38
257/76
2017/0133550 A1* 5/2017 Schuele ............. H01L 33/0079
(Continued)

*Primary Examiner* — Scott B Geyer
(74) *Attorney, Agent, or Firm* — McClure, Qualey & Rodack, LLP

(57) ABSTRACT

A display device includes a substrate, a first electrode, a second electrode, and a protective layer. The first electrode is disposed on the substrate. The second electrode has a first segment and a second segment. The first segment is located at a first side of the first electrode. The second segment is located at a second side of the first electrode. The second side is opposite to the first side. The protective layer overlaps the first segment and the second segment. The first segment has a length which is shorter than that of the second segment. The display device further includes a light-emitting element disposed on the substrate.

20 Claims, 4 Drawing Sheets

(51) Int. Cl.
*H01L 33/20* (2010.01)
*H01L 33/58* (2010.01)

(56) References Cited

U.S. PATENT DOCUMENTS

2017/0358563 A1* 12/2017 Cho .................. H01L 33/38
2018/0076355 A1* 3/2018 Hayashi ............. H01L 33/32

* cited by examiner

DISPLAY DEVICES

CROSS REFERENCE TO RELATED APPLICATIONS

This application claims priority of U.S. Provisional Application No. 62/500,539, filed on May 3, 2017 and China Patent Application No. 201710888168.4, filed on Sep. 27, 2017, the entirety of which is incorporated by reference herein.

BACKGROUND

Field of the Disclosure

The disclosure relates to display devices, and in particular to display devices formed by a fluid transfer process.

Description of the Related Art

Traditional technologies used for transferring the light-emitting diodes (LED) of LED display devices, such as inkjet printing or pick-and-place technologies, perform well in certain specific applications. However, these traditional technologies are not efficient enough to directly transfer LEDs. Therefore, these traditional technologies have room for improvement with respect to production yield and cost. Unlike these traditional technologies, a fluid transfer process can perform direct transfers of LEDs. The so-called fluid transfer process implies bringing LEDs into the openings of a substrate using a fluid, so that the LEDs can be electrically connected to a driving layer exposed by the openings of the substrate.

Although existing display devices using fluid transfer processes to form LEDs have been adequate for their intended purposes, they have not been entirely satisfactory in all respects. Therefore, there are still some problems that remain to be overcome with regards to the display devices using a fluid transfer process.

BRIEF SUMMARY

Some embodiments of the disclosure provide a display device. The display device includes a substrate, and a first electrode disposed on the substrate. The display device also includes a second electrode having a first segment and a second segment, wherein the first segment is located at a first side of the first electrode, the second segment is located at a second side of the first electrode, and the second side is opposite to the first side. The display device further includes a protective layer, wherein the protective layer overlaps the first segment and the second segment, and the first segment has a length which is shorter than that of the second segment. In addition, the display device includes a light-emitting element disposed on the substrate.

Some embodiments of the disclosure provide a display device. The display device includes a substrate, a first electrode and a second electrode disposed on the substrate, wherein the second electrode at least surrounds a portion of the first electrode. The display device also includes a protective layer disposed on the substrate and extending onto the second electrode, wherein a portion of the second electrode is exposed by an opening of the protective layer, and a first segment of the second electrode exposed by the protective layer has a length which is different from that of a second segment of the second electrode exposed by the protective layer in a cross-sectional view. The display device further includes a light-emitting element disposed in the opening.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that in accordance with standard practice in the industry, various features are not drawn to scale. In fact, the dimensions of the various features may be arbitrarily increased or reduced for clarity of discussion.

FIG. 1A is a cross-sectional view of the display device along line A-A' of FIG. 1B;

FIG. 2A is a cross-sectional view of the display device along line A-A' of FIG. 2B.

DETAILED DESCRIPTION OF THE INVENTION

Figure 1A:
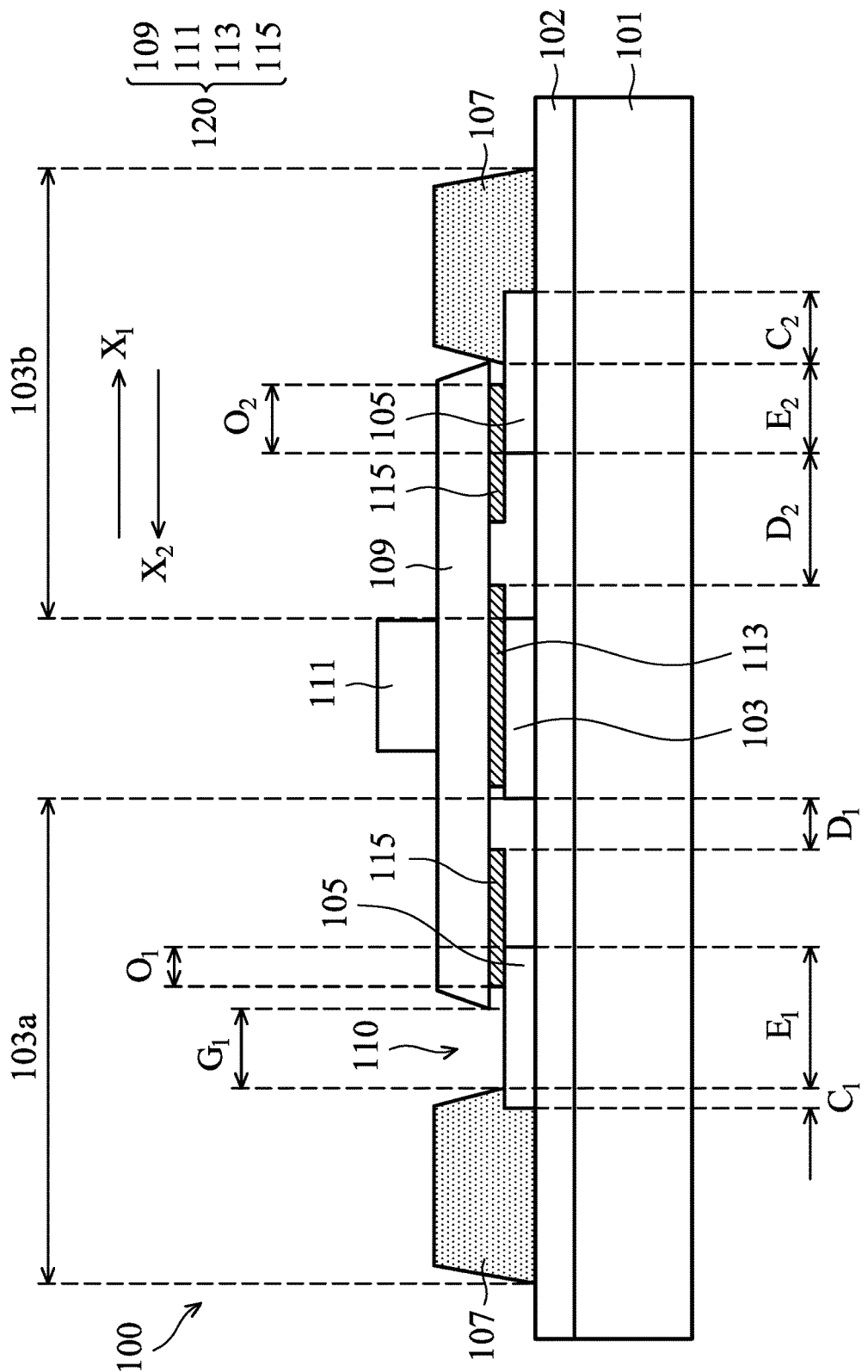
FIG. 1A is a cross-sectional view of a display device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for simplicity and clarity and does not in itself dictate a relationship between the various embodiments and/or configurations discussed.

Some embodiments are described below. Throughout the various views and illustrative embodiments, like reference numbers are used to designate like features. It should be understood that additional operations can be provided before, during, and after the method, and some of the operations described can be replaced or eliminated for other embodiments of the method.

Figure 1B:
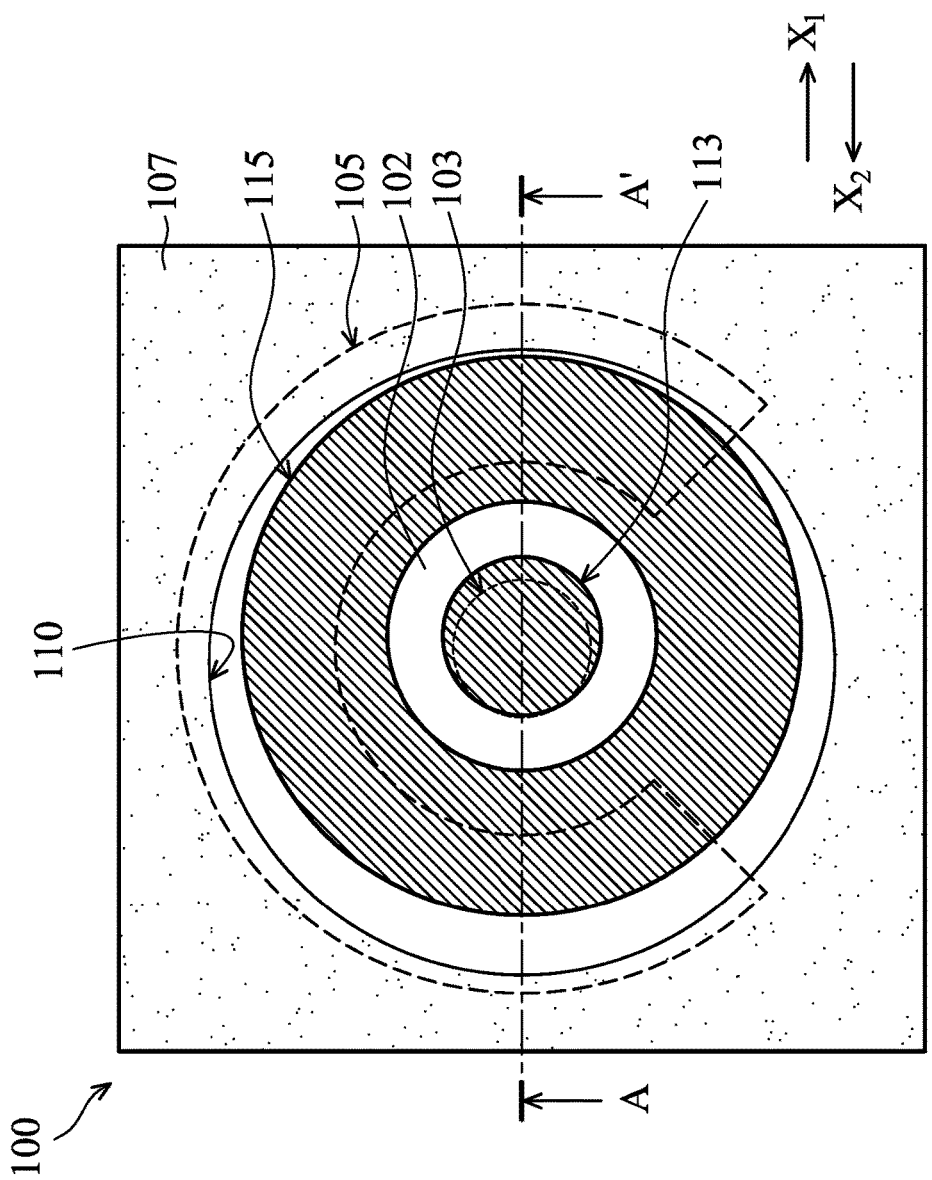
FIG. 1B is a partial top view of a display device in accordance with some embodiments.

FIG. 1A is a cross-sectional view of a display device 100 in accordance with some embodiments. FIG. 1B is a partial top view of the display device 100 in accordance with some embodiments (The substrate 109 and the directivity structure 111 of the light-emitting element 120 in FIG. 1A are not shown in FIG. 1B so that the partial top view may be clearer and more easily to be understood). FIG. 1A is a cross-sectional view of the display device 100 along line A-A' of FIG. 1B.

As shown in FIG. 1A, in accordance with some embodiments, a substrate 101 is provided, a driving layer 102 is disposed on the substrate 101, and a first electrode 103, a second electrode 105 and a protective layer 107 are disposed on the driving layer 102. In some embodiments, the substrate 101 may be a glass substrate or a plastic substrate, and the driving layer 102 may include a plurality of thin-film transistors (TFT), capacitors, conductive layers, contact windows, insulating layers or other semiconductor devices. Moreover, the driving layer 102 may be formed by a deposition process, a stamping process, an injecting process, or another applicable process.

As shown in FIGS. 1A and 1B, the second electrode 105 at least surrounds a portion of the first electrode 103, and the first electrode 103 is separated from the second electrode 105. Further, the protective layer 107 covers a portion of the second electrode 105. In other words, the protective layer 107 has an opening 110, and the first electrode 103 and at least a portion of the second electrode 105 are exposed by the opening 110.

Specifically, as shown in FIG. 1A, the left side of the first electrode 103 is defined as a first side 103a, and the right side of the first electrode 103 is defined as a second side 103b. The protective layer 107 covers a first segment $C_1$ of the second electrode 105, which is located at the first side 103a of the first electrode 103, and the protective layer 107 covers a second segment $C_2$ of the second electrode 105, which is located at the second side 103b of the first electrode 103. On the other hand, a third segment $E_1$ of the second electrode 105, which is located at the first side 103a of the first electrode 103, is exposed by the opening 110 of the protective layer 107. Moreover, a fourth segment $E_2$ of the second electrode 105, which is located at the second side 103b of the first electrode 103, is exposed by the opening 110 of the protective layer 107.

In some embodiments, as shown in FIG. 1B, the second electrode 105 is a ring structure with a gap in the top view. The width of the ring structure (i.e. the length in the cross-sectional view) is a constant value. Namely, in any cross-section which is vertical to the surface of the substrate 101, the portions of the second electrode 105 located at opposite sides of the first electrode 103 have the same length. Therefore, the sum of the lengths of the first segment $C_1$ and the third segment $E_1$ of the second electrode 105 is equal to the sum of the lengths of the second segment $C_2$ and the fourth segment $E_2$ of the second electrode 105.

It should be noted that in this embodiment, the length of the first segment $C_1$ is shorter than the length of the second segment $C_2$, and the length of the third segment $E_1$ is longer than the length of the fourth segment $E_2$. In other words, the opening 110 of the protective layer 107 is not bilaterally symmetrical about the center line of the first electrode 103.

In some embodiments, the first electrode 103 and the second electrode 105 may be made of a metal with good electrical conductivity, such as gold (Au), silver (Ag), copper (Cu), platinum (Pt), nickel (Ni), tin (Sn), magnesium (Mg), a combination thereof, or another conductive material. Moreover, the protective layer 107 may be made of an insulating inorganic material, such as silicon oxide, silicon nitride, or another applicable insulating organic material. In addition, the first electrode 103 and the second electrode 105 may be respectively formed by two individual processes, or simultaneously formed by the same process. The first electrode 103 and the second electrode 105 may be formed by a deposition process, a stamping process, an injecting process, or another applicable process. In some embodiments, the protective layer 107 and its opening 110 may be formed by a deposition process, a lithography process, and an etching process.

Still referring to FIG. 1A, a fluid transfer process is used to place a light-emitting element 120 on the substrate 101. In the fluid transfer process, the light-emitting element 120 is placed in the opening 110 of the protective layer 107 by the fluid flowing in direction $X_1$, and a single opening 110 can accommodate a single light-emitting element 120.

In some embodiments, the light-emitting element 120 includes a substrate 109, a directivity structure 111, a third electrode 113, and a fourth electrode 115. The third electrode 113 and the fourth electrode 115 are located on a first side of the light-emitting element 120, and the directivity structure 111 is located on a second side of the light-emitting element 120, which is opposite to the first side of light-emitting element 120. In addition, the third electrode 113 is separated from the fourth electrode 115, and the fourth electrode 115 at least surrounds a portion of the third electrode 113.

Moreover, the light-emitting element 120 may be a light-emitting diode (LED), especially a flip-chip light-emitting diode. In some embodiments, the substrate 109 of the light-emitting element 120 may be made of silicon, silicon carbide (SiC), gallium nitride (GaN), silicon dioxide ($SiO_2$), sapphire, or a combination thereof. The processes and materials of the third electrode 113 and the fourth electrode 115 are similar to, or the same as, those used to form the first electrode 103 and the second electrode 105, and are not repeated herein. In some embodiments, the material of the directivity structure 111 can be lattice-matched to the material of the substrate 109, and the directivity structure 111 is a protruding structure located at the center of the substrate 109.

Specifically, the first side of the light-emitting element 120 (i.e. the side which the third electrode 113 and the fourth electrode 115 are located on) is disposed facing the substrate 101, and the second side of the light-emitting element 120 (i.e. the side which the directivity structure 111 is located on) is disposed away from the substrate 101, so that the display device 100 is complete. Based on the foregoing arrangements, the third electrode 113 of the light-emitting element 120 can be electrically connected to the first electrode 103 on the driving layer 102, and the fourth electrode 115 of the light-emitting element 120 can be electrically connected to the second electrode 105 on the driving layer 102.

In some embodiments, the third electrode 113 is in direct contact with the first electrode 103, and the fourth electrode 115 is in direct contact with the second electrode 105. It should be noted that the third electrode 113 is a first conductivity type, the fourth electrode 115 is a second conductivity type, and the first conductivity type is opposite to the second conductivity type. Specifically, the third electrode 113 and the fourth electrode 115 are electrically connected to the doped semiconductor material layers having opposite conductivity types in the light-emitting element 120, respectively. In this embodiment, the first conductivity type is P-type, and the second conductivity type is N-type. In other embodiments, the first conductivity type is N-type, and the second conductivity type is P-type.

Moreover, by disposing the directivity structure 111 in the light-emitting element 120, the probability that the light-emitting element 120 is turned upside down during the fluid transfer process may be decreased. Therefore, the third electrode 113 and the fourth electrode 115 of the light-emitting element 120 are facing the substrate 101, and the directivity structure 111 is located on the side of the light-emitting element 120 which is away from the substrate 101.

It should be noted that when the light-emitting element 120 is placed in the opening 110 by the fluid flowing in direction $X_1$, the light-emitting element 120 may deviate from the center of the opening 110 easily due to the flow direction of the fluid. As a result, the light-emitting element 120 may contact the protective layer 107 located at the second side 103b of the first electrode 103. In the display device 100 of FIG. 1A, the light-emitting element 120 and the protective layer 107 located at the first side 103a of the first electrode 103 have a gap $G_1$ between them, and the light-emitting element 120 and the protective layer 107 located at the second side 103b of the first electrode 103 have no gap between them.

In this embodiment, the portions of the second electrode 105 located at opposite sides of the first electrode 103 (i.e. the first side 103a and the second side 103b) and covered by the protective layer 107 have different lengths. That is, the portions of the second electrode 105 at opposite sides of the first electrode 103, which are exposed by the opening 110, have different lengths. Therefore, after performing the fluid transfer process, the proportion of the area of the first electrode 103 covered by the third electrode 113 of the light-emitting element 120 can be 70% and above.

In other words, although the light-emitting element 120 may deviate from the center of the opening 110 easily due to the flow direction of the fluid, which makes the center line of the third electrode 113 not aligned with the center line of the first electrode 103. By the foregoing arrangement of the location of the opening 110, the third electrode 113 can still cover over 70% (including 70%) of the area of the first electrode 103 (For example, 77.9% of the area of the first electrode 103 is covered by the third electrode 113). As a result, better performance in brightness can be produced, and the entire performance of the display device 100 can be improved.

Furthermore, after performing the fluid transfer process, in the display device 100, the fourth electrode 115 of the light-emitting element 120 and the first electrode 103 can still have a distance $D_1$ between them, and the third electrode 113 of the light-emitting element 120 and the second electrode 105 can still have a distance $D_2$ between them. The distance $D_1$ is the shortest distance between the fourth electrode 115 and the first electrode 103, and the distance $D_2$ is the shortest distance between the third electrode 113 and the second electrode 105. It should be noted that distance $D_1$ and distance $D_2$ are long enough to avoid short-circuits.

In this embodiment, as shown in FIG. 1A, the flowing direction $X_1$ of the fluid is a direction from the location of the distance $D_1$ to the location of the distance $D_2$, and the distance $D_1$ is shorter than the distance $D_2$. In some embodiments, the distance $D_1$ and the distance $D_2$ are more than about 2 µm so that short-circuits do not happen.

In addition, the fourth electrode 115 has a fifth segment $O_1$ located at the first side 103a, and the fifth segment $O_1$ is defined as the overlapping portion between the fourth electrode 115 and second electrode 105 at the first side 103a. The fourth electrode 115 has a sixth segment $O_2$ located at the second side 103b, and the sixth segment $O_2$ is defined as the overlapping portion between the fourth electrode 115 and the second electrode 105 at the second side 103b. In this embodiment, the fifth segment $O_1$ has a length which is shorter than that of the sixth segment $O_2$.

Moreover, the distance $D_1$ and the distance $D_2$ are also called shift margins of the fluid transfer process. In order to prevent problems with short-circuiting, when planning for the processes of the display device 100, the foregoing shift margins can be increased so that the product yields can also be increased.

Figure 2A:
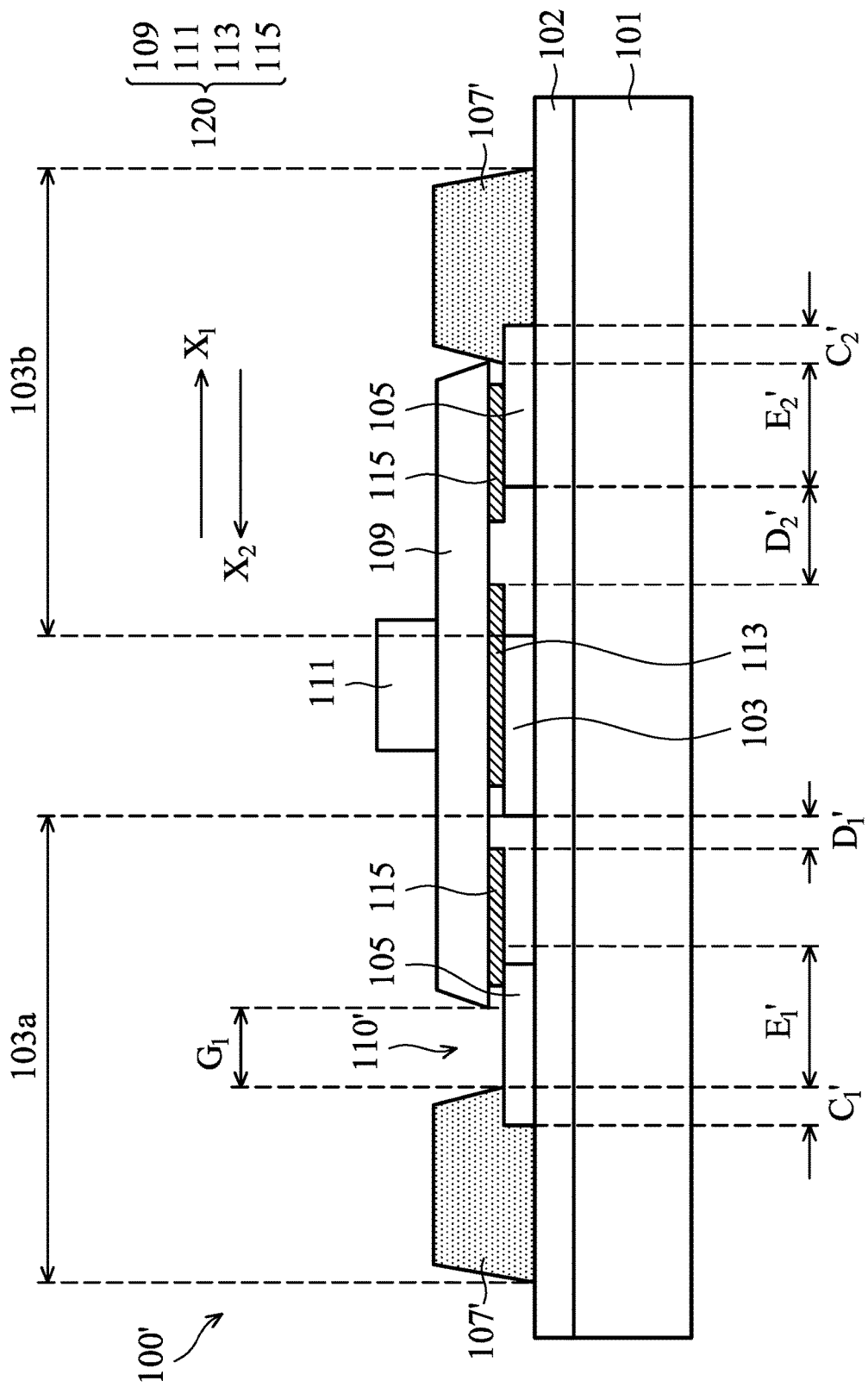
FIG. 2A is a cross-sectional view of a comparative display device.
Figure 2B:
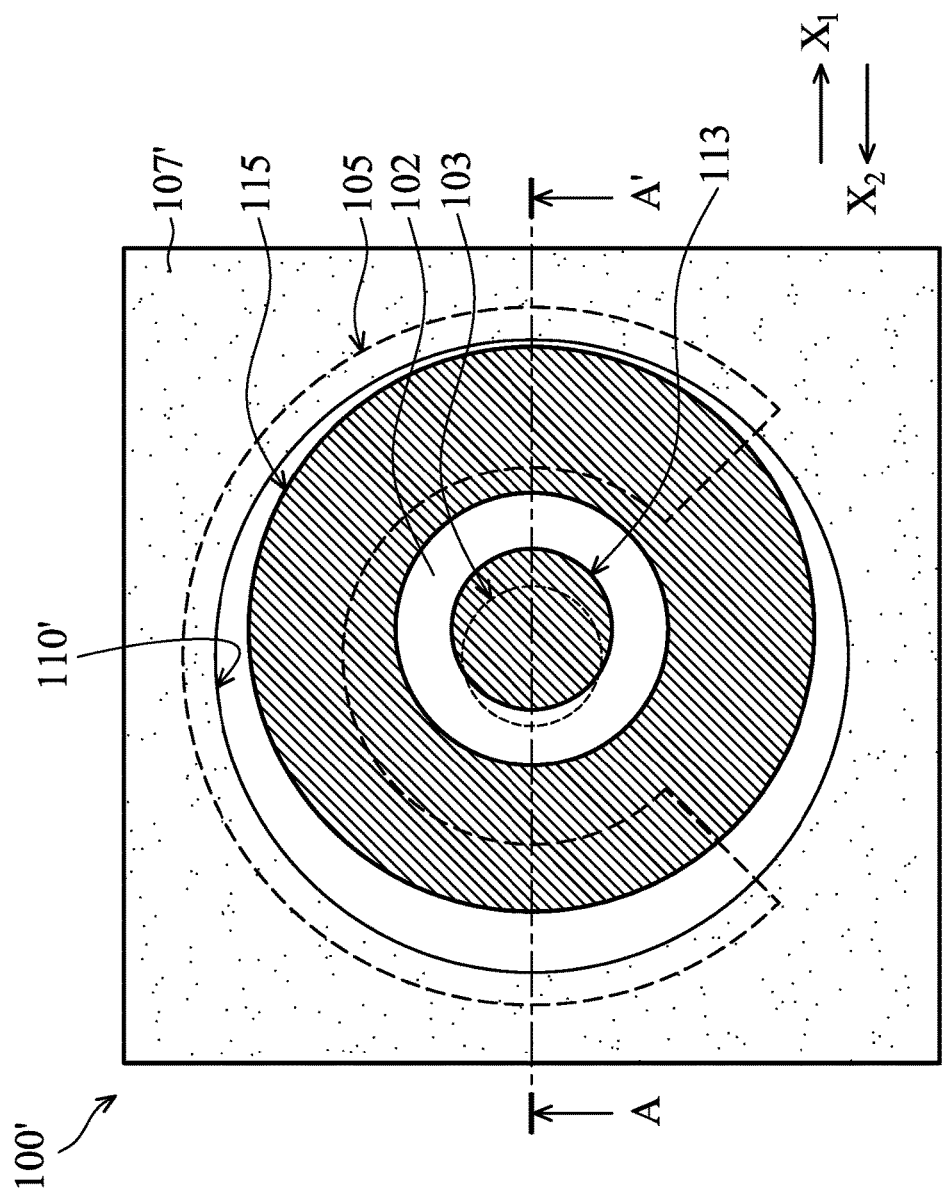
FIG. 2B is a partial top view of a comparative display device.

FIG. 2A is a cross-sectional view of a comparative display device 100'. FIG. 2B is a partial top view of the comparative display device 100' (The substrate 109 and the directivity structure 111 of the light-emitting element 120 in FIG. 2A are not shown in FIG. 2B so that the partial top view may be clearer and more easily to be understood). FIG. 2A is a cross-sectional view of the display device 100' along line A-A' of FIG. 2B.

As shown in FIGS. 1A and 2A, the protective layer 107' of the display device 100' is located at a position different from that of the protective layer 107 of the display device 100. In other words, the location of the opening 110' in FIG. 2A is different from the location of the opening 110 in FIG. 1A.

Specifically, in the display device 100 of FIG. 1A, the portions of the second electrode 105 located at opposite sides of the first electrode 103 (i.e. the first side 103a and the second side 103b) and covered by the protective layer 107 have different lengths, and the portions of the second electrode 105 at opposite sides of the first electrode 103, which are exposed by the opening 110, have different lengths. However, in the display device 100' of FIG. 2A, the portions of the second electrode 105 located at opposite sides of the first electrode 103 and are covered by the protective layer 107' have the same length, and the portions of the second electrode 105 at opposite sides of the first electrode 103, which are exposed by the opening 110', also have the same length.

In the display device 100' shown in FIG. 2A, the protective layer 107' covers a first segment $C_1'$ of the second electrode 105, which is located at the first side 103a of the first electrode 103, and the protective layer 107' covers a second segment $C_2'$ of the second electrode 105, which is located at the second side 103b of the first electrode 103. On the other hand, a third segment $E_1'$ of the second electrode 105, which is located at the first side 103a of the first electrode 103, is exposed by the opening 110' of the protective layer 107. Moreover, a fourth segment $E_2'$ of the second electrode 105, which is located at the second side 103b of the first electrode 103, is exposed by the opening 110' of the protective layer 107'.

As shown in FIG. 2A, the sum of the lengths of the first segment $C_1'$ and the third segment $E_1'$ of the second electrode 105 is equal to the sum of the lengths of the second segment $C_2'$ and the fourth segment $E_2'$ of the second electrode 105. It should be noted that the length of the first segment $C_1'$ is equal to the length of the second segment $C_2'$, and the length of the third segment $E_1'$ is equal to the length of the fourth segment $E_2'$. In other words, the opening 110' of the protective layer 107' is bilaterally symmetrical about the center line of the first electrode 103 of the display device 100'.

Apart from the difference of the locations of the above-mentioned opening 100 and the opening 100', the materials and the processes of each of the elements in FIGS. 2A and 2B are similar to, or the same as, those used to form the corresponding elements in FIGS. 1A and 1B, and are not repeated herein.

As shown in FIG. 2A, when the light-emitting element 120 is placed in the opening 110' by the fluid flowing in direction $X_1$, the light-emitting element 120 may deviate from the center of the opening 110' easily due to the flow direction of the fluid. As a result, the light-emitting element 120 may contact the protective layer 107' located at the second side 103b of the first electrode 103. In the display device 100' of FIG. 2A, the light-emitting element 120 and the protective layer 107' located at the first side 103a of the first electrode 103 have the gap $G_1$ between them, and the light-emitting element 120 and the protective layer 107' located at the second side 103b of the first electrode 103 have no gap between them.

Since the opening 110' of FIG. 2A and the opening 110 of FIG. 1A are the same size, the gap G1 of FIG. 2A has a length which is equal to that of the gap $G_2$ of FIG. 1A.

In the comparative example, as shown in FIGS. 2A and 2B, the light-emitting element 120 may deviate from the center of the opening 110' of the protective layer 107' due to the flow direction of the fluid, such that only a portion of the first electrode 103 can be covered by the third electrode 113 (less than 70% of the area of the first electrode 103 is covered by the third electrode 113, for example, 67.8% of the area of the first electrode 103 is covered by the third electrode 113). As a result, a distance $D_1$' between the fourth electrode 115 of the light-emitting element 120 and the first electrode 103, and a distance $D_2$' between the third electrode 113 of the light-emitting element 120 and the second electrode 105 are too small, such that short-circuit problems may easily occur.

Still referring to FIGS. 1A and 1B, to overcome problems such as the short-circuits that can easily occur in the display device 100', the opening 110' of the protective layer 107' in FIG. 2A is moved a distance in direction $X_2$ so that the protective layer 107 having the opening 110 is formed in FIG. 1A. It should be noted that the light-emitting element 120 is placed in the opening 110 and the opening 110' by the fluid in direction $X_1$, and the direction $X_2$ is opposite to the direction $X_1$.

In some embodiments, the opening 110' of the protective layer 107' is moved in direction $X_2$ by a distance of about 0.5 μm to about 1.2 μm, or from about 0.8 μm to about 1.1 μm. As a result, as shown in FIG. 1A, the first segment $C_1$ has a length which is shorter than that of the second segment $C_2$, and the third segment $E_1$ has a length which is longer than that of the fourth segment $E_2$. In some embodiments, the length difference between the first segment $C_1$ and the second segment $C_2$ is in a range from about 1 μm to about 2.4 μm, especially in a range from about 1.6 μm to about 2.2 μm.

It should be noted that, in comparison with the display device 100' in FIG. 2A (in the display device 100', the length of the first segment $C_1$ is equal to the length of the second segment $C_2$), the first segment $C_1$ of the display device 100 in FIG. 1A has a length which is shorter than that of the first segment $C_1$' in FIG. 2A, and the second segment $C_2$ in FIG. 1A has a length which is longer than that of the second segment $C_2$' in FIG. 2A. Moreover, the third segment $E_1$ in FIG. 1A has a length which is longer than that of the third segment $E_1$' in FIG. 2A, and the fourth segment $E_2$ in FIG. 1A has a length which is shorter than that of the fourth segment $E_2$' in FIG. 2A.

As shown in FIGS. 1A and 2A, in the embodiment of FIG. 1A, since the location of the opening 110 of the protective layer 107 is adjusted, the shift margin of the fluid transfer process for forming the light-emitting element 120 is increased. Therefore, the short-circuit problems that can occur between the first electrode 103 and the fourth electrode 115, and between the second electrode 105 and the third electrode 113, may be avoided. For example, in comparison with the display device 100' shown in FIG. 2A, the distance $D_1$ between the fourth electrode 115 of the light-emitting element 120 and the first electrode 103, and the distance $D_2$ between the third electrode 113 of the light-emitting element 120 and the second electrode 105 in FIG. 1A are much greater. Namely, the distance $D_1$ is longer than the distance $D_1$', and the distance $D_2$ is longer than the distance $D_2$'.

As shown in FIG. 1A, in accordance with some embodiments, the location of the opening 110 of the protective layer 107 is adjusted. After the fluid transfer process places the light-emitting element 120 in the opening 110, the third electrode 113 of the light-emitting element 120 can cover over 70% (including 70%) of the area of the first electrode 203, so as to make the light-emitting element 120 produce a better light performance, and increase the entire performance of the display device 100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display device, comprising:
    a substrate;
    a first electrode disposed on the substrate;
    a second electrode having a first segment and a second segment, wherein the first segment is located at a first side of the first electrode, the second segment is located at a second side of the first electrode, and the second side is opposite to the first side;
    a protective layer, wherein the protective layer overlaps the first segment and the second segment, and the first segment has a length which is shorter than that of the second segment; and
    a light-emitting element disposed on the substrate.

2. The display device as claimed in claim 1, wherein a length difference between the first segment and the second segment is in a range from 1 μm to 2.4 μm.

3. The display device as claimed in claim 2, wherein the length difference between the first segment and the second segment is further in a range from 1.6 μm to 2.2 μm.

4. The display device as claimed in claim 1, wherein the second electrode further comprises a third segment and a fourth segment, the third segment is located at the first side, the fourth segment is located at the second side, the third segment and the fourth segment are exposed by the protective layer, and the third segment has a length which is longer than that of the fourth segment.

5. The display device as claimed in claim 4, wherein a sum of the lengths of the first segment and the third segment is equal to a sum of the lengths of the second segment and the fourth segment.

6. The display device as claimed in claim 1, wherein the light-emitting element is a light-emitting diode, and the light-emitting diode comprises a third electrode and a fourth electrode located at the same side of the light-emitting diode, wherein the fourth electrode at least surrounds a portion of the third electrode.

7. The display device as claimed in claim 6, wherein the light-emitting element further comprises a directivity structure, and the directivity structure and the third electrode are located at opposite sides of the light-emitting element.

8. The display device as claimed in claim 6, wherein the third electrode at least covers 70% of an area of the first electrode.

9. The display device as claimed in claim 6, wherein a sidewall of the light-emitting diode located at the second side is in contact with the protective layer.

10. The display device as claimed in claim 9, wherein another sidewall of the light-emitting diode located at the first side and the protective layer have a gap therebetween.

11. The display device as claimed in claim 6, wherein the fourth electrode has a fifth segment and a sixth segment, the fifth segment is located at the first side, the sixth segment is located at the second side, the second electrode overlaps the fifth segment and the sixth segment, and the fifth segment has a length which is shorter than that of the sixth segment.

12. The display device as claimed in claim 6, wherein the third electrode is a first conductivity type, and the fourth electrode is a second conductivity type, wherein the first conductivity type is opposite to the second conductivity type.

13. The display device as claimed in claim 6, wherein the first electrode is electrically connected to the third electrode, and the second electrode is electrically connected to the fourth electrode.

14. The display device as claimed in claim 1, further comprising:
   a driving layer disposed on the substrate, wherein the first electrode, the second electrode and the protective layer are disposed on the driving layer, and
   wherein the second electrode at least surrounds a portion of the first electrode.

15. The display device as claimed in claim 1, wherein the second electrode and the protective layer are not bilaterally symmetrical about a center line of the first electrode.

16. A display device, comprising:
   a substrate;
   a first electrode and a second electrode disposed on the substrate, wherein the second electrode at least surrounds a portion of the first electrode;
   a protective layer disposed on the substrate and extending onto the second electrode, wherein a portion of the second electrode is exposed by an opening of the protective layer, and a first segment of the second electrode exposed by the protective layer has a length which is different from that of a second segment of the second electrode exposed by the protective layer in a cross-sectional view; and
   a light-emitting element disposed in the opening.

17. The display device as claimed in claim 16, wherein the first segment and the second segment are located at opposite sides of the first electrode.

18. The display device as claimed in claim 16, wherein a third segment of the second electrode covered by the protective layer has a length which is different from that of a fourth segment of the second electrode covered by the protective layer in the cross-sectional view.

19. The display device as claimed in claim 18, wherein the third segment and the fourth segment are located at opposite sides of the first electrode.

20. The display device as claimed in claim 16, wherein the light-emitting element further comprises a third electrode and a fourth electrode, and the fourth electrode at least surrounds a portion of the third electrode, and wherein a fifth segment of the fourth electrode overlapped with the second electrode has a length which is different from that of a sixth segment of the fourth electrode overlapped with the second electrode in the cross-sectional view.

* * * * *